US006492761B1

(12) United States Patent
Perez

(10) Patent No.: US 6,492,761 B1
(45) Date of Patent: Dec. 10, 2002

(54) DIGITAL PIEZOELECTRIC TRANSDUCERS AND METHODS

(75) Inventor: Gritsko Perez, Evington, VA (US)

(73) Assignee: Ericsson Inc., Research Triangle Park, NC (US)

( * ) Notice: Subject to any disclaimer, the term of this patent is extended or adjusted under 35 U.S.C. 154(b) by 0 days.

(21) Appl. No.: 09/009,520

(22) Filed: Jan. 20, 1998

(51) Int. Cl.[7] .................................... H01L 41/04
(52) U.S. Cl. .................................... 310/324; 310/334
(58) Field of Search .................................... 310/324, 334, 310/366

(56) References Cited

U.S. PATENT DOCUMENTS

| | | | | |
|---|---|---|---|---|
| 3,153,229 A | * 10/1964 | Roberts | ..................... | 310/328 |
| 3,947,708 A | 3/1976 | Fulenwider | ................. | 310/330 |
| 4,515,997 A | * 5/1985 | Stinger, Jr. | .................. | 341/151 |
| 4,885,781 A | * 12/1989 | Seidel | ........................ | 310/324 |
| 5,821,666 A | * 10/1998 | Matsumoto et al. | ... | 310/316.01 |

FOREIGN PATENT DOCUMENTS

| | | |
|---|---|---|
| GB | 1382927 | 2/1975 |
| JP | 58200698 | 11/1983 |
| JP | 59128900 | 7/1984 |
| JP | 59188295 | 10/1984 |

* cited by examiner

*Primary Examiner*—Nestor Ramirez
*Assistant Examiner*—Peter Medley
(74) *Attorney, Agent, or Firm*—Myers Bigel Sibley & Sajovec

(57) ABSTRACT

A digitally driven piezoelectric transducer uses a flat piezoelectric element having a plurality of electrically isolated conductive sections coupled to one side of said piezoelectric element and a conductive ground plate coupled to another side of said piezoelectric element. In addition, a resonant cavity is coupled to said piezoelectric element and intensifies the acoustic or sound energy produced by said piezoelectric transducer. This digitally driven piezoelectric transducer avoids the problems associated with electromagnetic interference by avoiding additional analog circuitry previously needed to create sound audible for humans.

20 Claims, 7 Drawing Sheets

DIGITAL PIEZOELECTRIC TRANSDUCERS AND METHODS

BACKGROUND OF THE INVENTION

1. Field of Invention

The present invention relates to piezoelectric transducers and more specifically to piezoelectric transducers driven by digital signals thereby eliminating additional analog circuitry in electronic devices.

2. The Prior Art

A piezoelectric element is a crystal which delivers a voltage when mechanical force is applied between its faces, and it deforms mechanically when voltage is applied between its faces. Because of these characteristics a piezoelectric element is capable of acting as both a sensing and a transmitting element. Piezoelectricity exists because some atomic lattice structures have as an essential cell a cubic or rhomboid atomic cage, and this cage holds a semi-mobile ion which has several stable quantum position states inside itself. The ion's post ion state can be caused to shift by either deforming the cage or by applying an electric field or voltage. The coupling between the central ion and the cage transforms electrical charge to mechanical strain and vice versa.

Based on these fundamental principles of piezoelectricity, it is well known that if an analog signal is applied to a piezoelectric element, the piezoelectric element will deform, thereby creating a sound pressure which in turn may create an audible sound. Piezoelectric speakers can generate a wide range of high sound pressures. In addition, piezoelectric elements may be manufactured using an ultra thin piezoelectric film, which allows the piezoelectric elements to be made quite small. Such piezoelectric elements have been used to provide sound audible in the human hearing range for such devices as speakers for computers, cordless phones, alarm clocks, fire alarms, buzzers, headphones, and earphones driven by analog signals.

Unlike conventional speaker systems, a piezoelectric element is capable of creating a sound without a fragile or moving coil. Piezoelectric elements thus are ideal for today's electronic devices because they do not emit a significant amount of electrical noise or electromagnetic interference ("EMI"). The EMI produced by coil-based speakers is usually lower than the EMI generated by the audio, radio and power supply circuitry. As a more significant advantage, piezoelectric transducers are significantly cheaper than electrodynamic speakers. In addition, piezoelectric elements are compatible with solid state devices because they are rugged, compact, reliable and efficient. A further benefit of piezoelectric elements is that they consume a little amount of power compared to the amount of acoustic pressure they can generate.

A problem with conventional piezoelectric elements is that in order for them to reproduce human voice or music sounds with acceptable quality they have had to be driven by analog voltage signals. See FIGS. 3 and 4, and discussion below. Because piezoelectric elements used to reproduce human voice or musical sounds are driven by analog voltage signals, any system using these devices must incorporate analog circuitry, such as an operational amplifier circuit or a digital to analog converter. Analog circuitry is sensitive to noise and EMI. EMI disturbs electronic equipment, as perceived in the form of undesired audible noises and distortions on the output audio signal of cellular phones and other equipment. An electromagnetic field is a combination of electric and magnetic fields. The frequency of oscillation can range from a fraction of one Hertz (cycle per second) to many million Hertz. EMI will decrease the overall performance and reliability of affected electronic devices using analog circuits.

Currently, cellular phones are designed with analog driven electrodynamic speakers to generate audible sounds. As illustrated by the schematic in FIG. 4, these prior art systems use digital signal processors or microprocessors to drive a digital to analog converter, which in turn, provides an analog signal to the electrodynamic speaker.

Another method of providing sound is depicted in more detail in FIG. 3, wherein a piezoelectric element is driven directly by an analog signal. These piezoelectric systems also use a digital to analog converter to create a usable signal for the piezoelectric transducers. Both of these prior art systems are susceptible to the problems associated with EMI, which is a common source of noise heard in acoustic generation devices.

The EMI which causes unwanted noise in the speakers of modern communication devices, such as cellular phones, is largely generated by the analog and digital circuitry associated with the means for driving said speakers. In cellular communication systems several different mobile units share the same set of frequency channels at the same time. In order to share the same frequency, the mobile units using the system sample a given set of frequency channels (spread spectrum) at a predetermined and controlled rate. The three basic spread spectrum types are code-division multiple access (CDMA), time-vision multiple access (TDMA), and frequency-vision multiple access. Turning the sampling circuitry, which monitors the signals being sent by a base station, on and off at high rates of speed generates EMI. Such EMI can cause problems with cellular phone spear clarity, because it is a source of noise which can be heard by humans on the speaker system. Some say the noise makes the phone sound as if the speaker is making a low hissing or crackling sound ("motor-boating").

Thus, a need exists in the electronic industry to replace analog driven speakers in various products, including cellular phones, with purely digitally driven speakers which are less susceptible to EMI. The present invention discloses a digitally driven piezoelectric transducer which is not dependent on analog circuitry to produce audible sound, thereby eliminating the problems with EMI and the need for additional analog circuitry.

SUMMARY OF THE INVENTION

The present invention comprises a digitally driven piezoelectric transducer. The invention uses a piezoelectric element having a plurality of electrically isolated conductive sections carried by one side of the piezoelectric element and a conductive common plate carried by the other side of the piezoelectric element. In addition, the invention includes a resonant cavity which is connected with the piezoelectric element which intensifies the sound energy produced by the piezoelectric transducer.

A digitally driven piezoelectric transducer avoids the problems associated with EMI because it eliminates the need for additional analog circuitry to create sound audible to humans. In the invention, a plurality of electrically isolated conductive strips of varying size are carried by one side of a piezoelectric element. The electrically isolated conductive strips may take the form of any convenient shape and are specifically designed to cover areas of predetermined sizes on said piezoelectric element. The electrically isolated conductive strips are integrally formed with the piezoelectric element, covering predetermined surface areas to form a binary progression. Each electrically isolated conductive section is driven by a different bit of the parallel digital signal supplying the acoustic information, and thus generating sounds in different ranges according to the input signals.

The present invention therefore avoids the problems with prior art speaker systems by avoiding the use of digital to analog conversion circuitry. By not using this conversion circuitry, the invention allows designers to avoid using unnecessary analog circuitry that is susceptible to EMI. In addition, since digital piezoelectric transducers have no coils or magnets, they are less likely to pick up EMI radiated by other systems.

DETAILED DESCRIPTION OF THE DRAWINGS

Figure 6B:
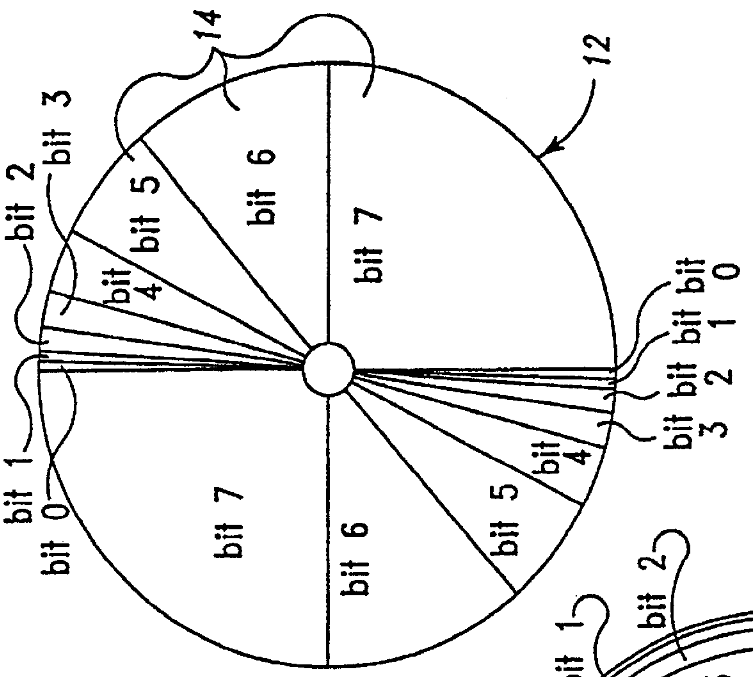
Figure 6C:
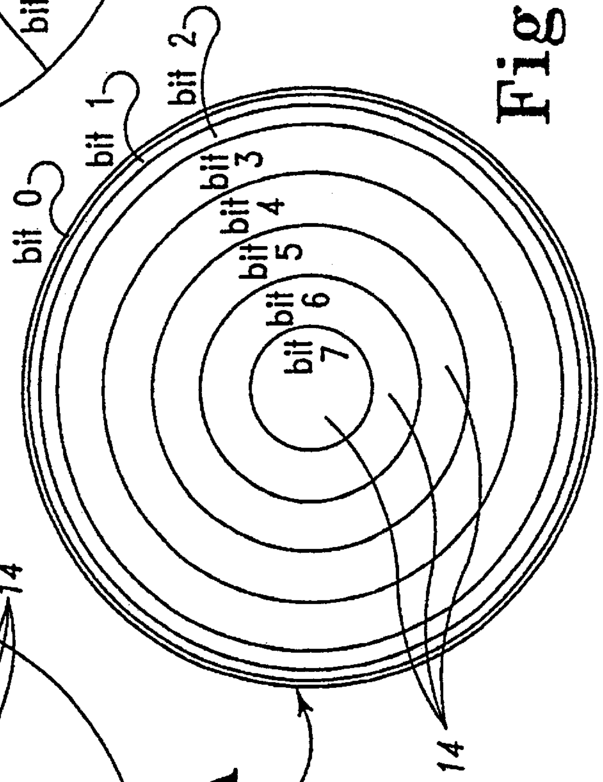
Figure 6A:
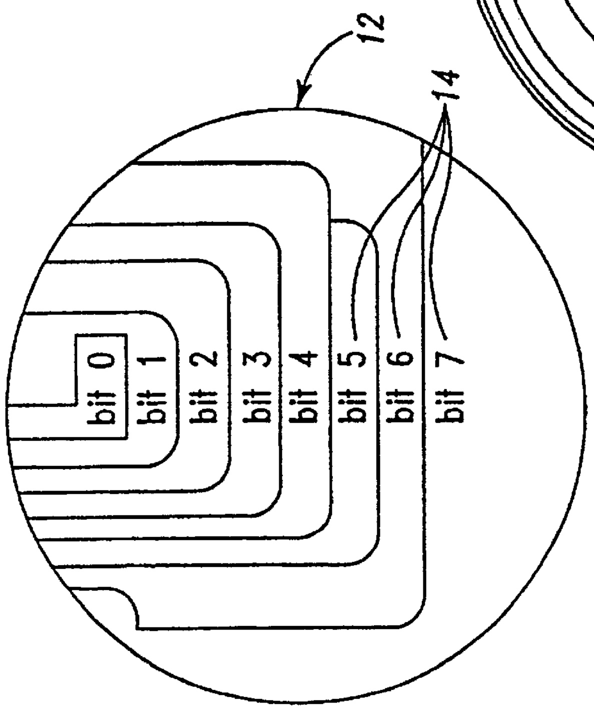

FIGS. 6A, B and C depict several digital piezoelectric transducers having electrically isolated conductive sections formed in different sizes and shapes.

DETAILED DESCRIPTION OF THE INVENTION

Figure 1:
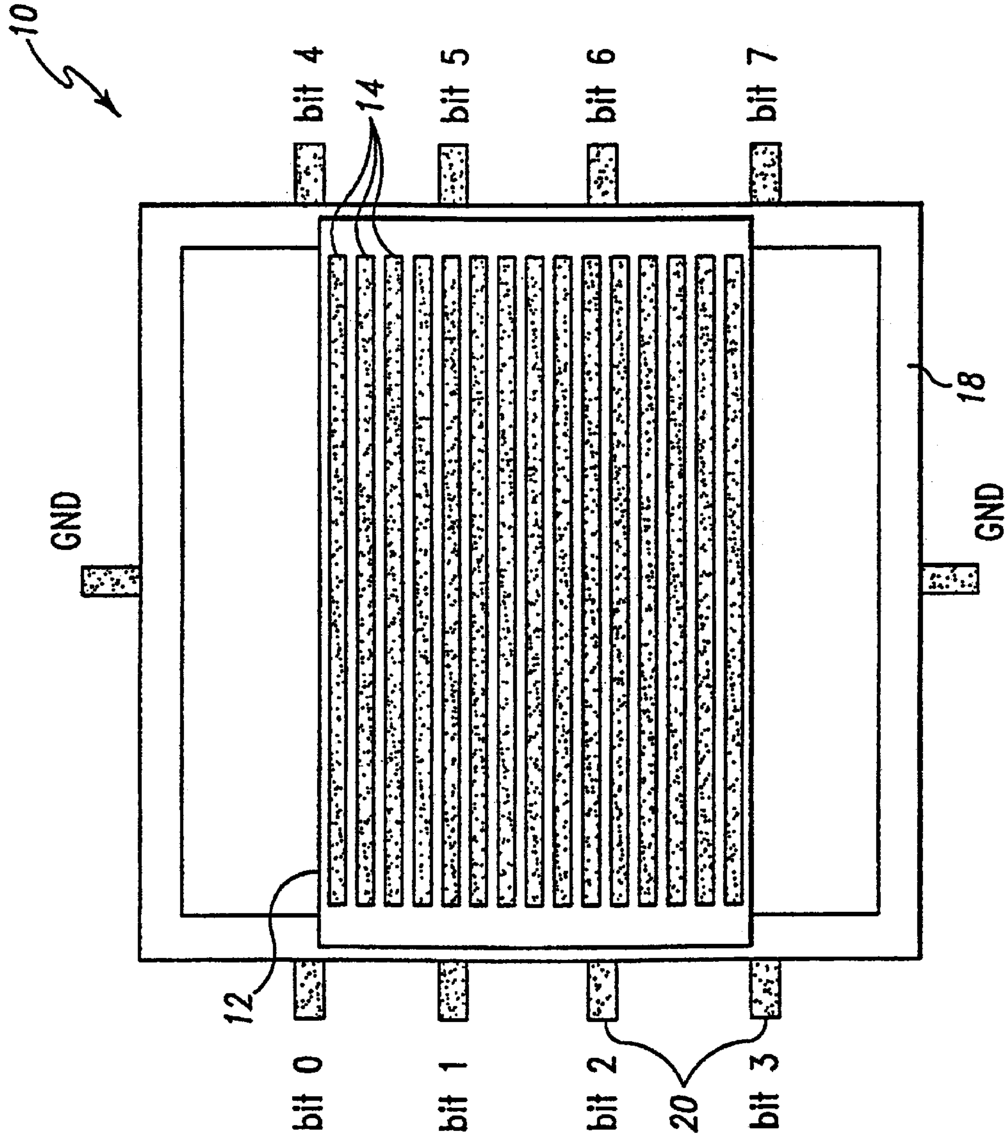
FIG. 1 shows in plane view a schematic embodiment of a digital piezoelectric transducer.

The present invention discloses a piezoelectric transducer that is capable of being directly driven by a digital signal. FIG. 1 shows a simplified digital piezoelectric transducer 10 of the present invention. The digital piezoelectric transducer 10 comprises a piezoceramic plate 12 with a plurality of electrically isolated conductive sections 14 carried on one side. In addition, a conductive common plate 16 is carried on the opposite side of the piezoceramic plate. See FIG. 2. As depicted, a resonant cavity 18 may be coupled to the piezoceramic plate 12 for providing support to the piezoceramic plate 12. The resonant cavity 18 can be formed in any shape suitable for intensifying and directing the sound generated by vibrations of the piezoceramic plate 12.

Referring once again to FIG. 1, the digital piezoelectric transducer 10 has a resonant cavity 18 so that the sound generated is intensified. The resonant cavity 18 is formed with a means for providing parallel digital signals to the electrically isolated conductive sections 14 which are integrally formed on the resonant cavity 18. For example, the resonant cavity 18 may be coupled by a plurality of fixed contacts 20 that are connected with said plurality of electrically isolated conductive sections 14. These fixed contacts 20 may then be used for coupling a parallel digital signal containing sound to the plurality of electrically isolated sections 14.

Figure 2:
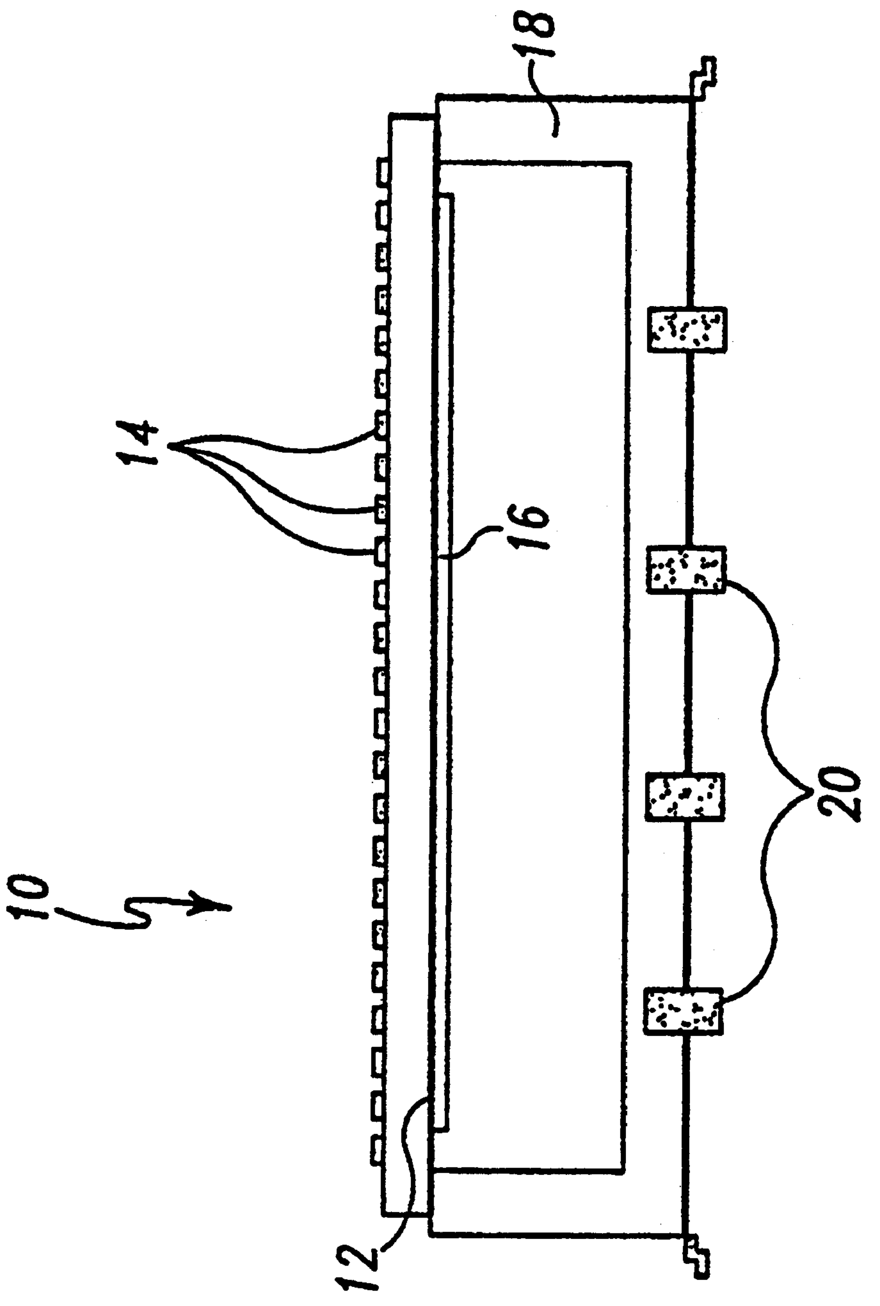
FIG. 2 is a diagrammatic illustration in side view of a digital piezoelectric transducer taken from a side view perspective.
Figure 3:
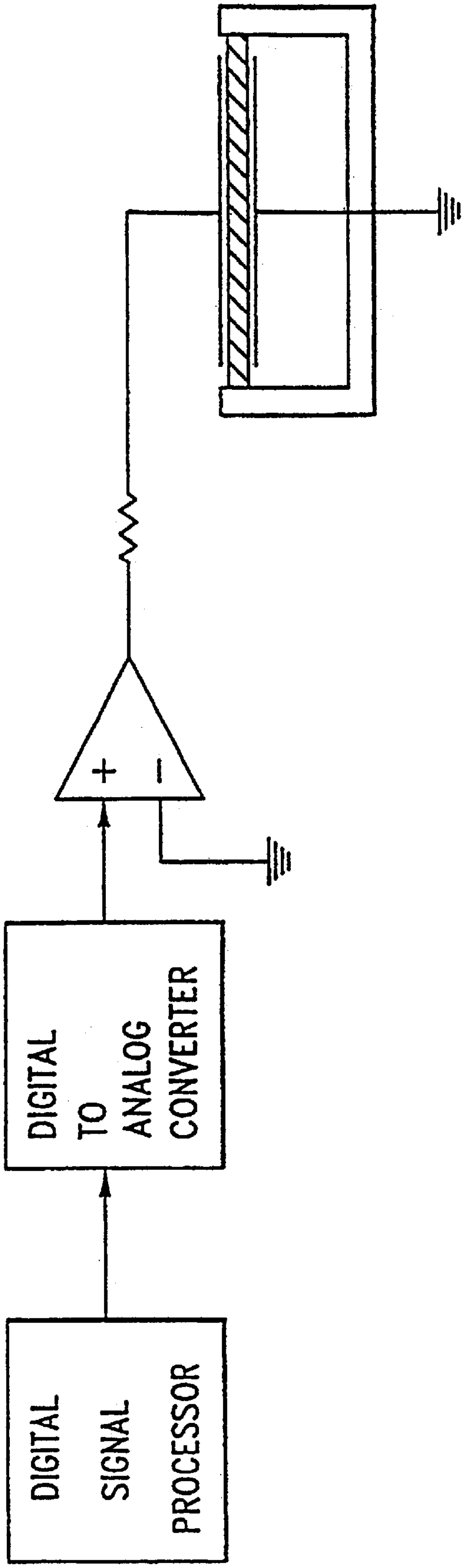
Fig. 3 (PRIOR ART)
FIG. 3 shows schematically a prior art analog piezoelectric transducer and the circuitry for driving same.
Figure 4:
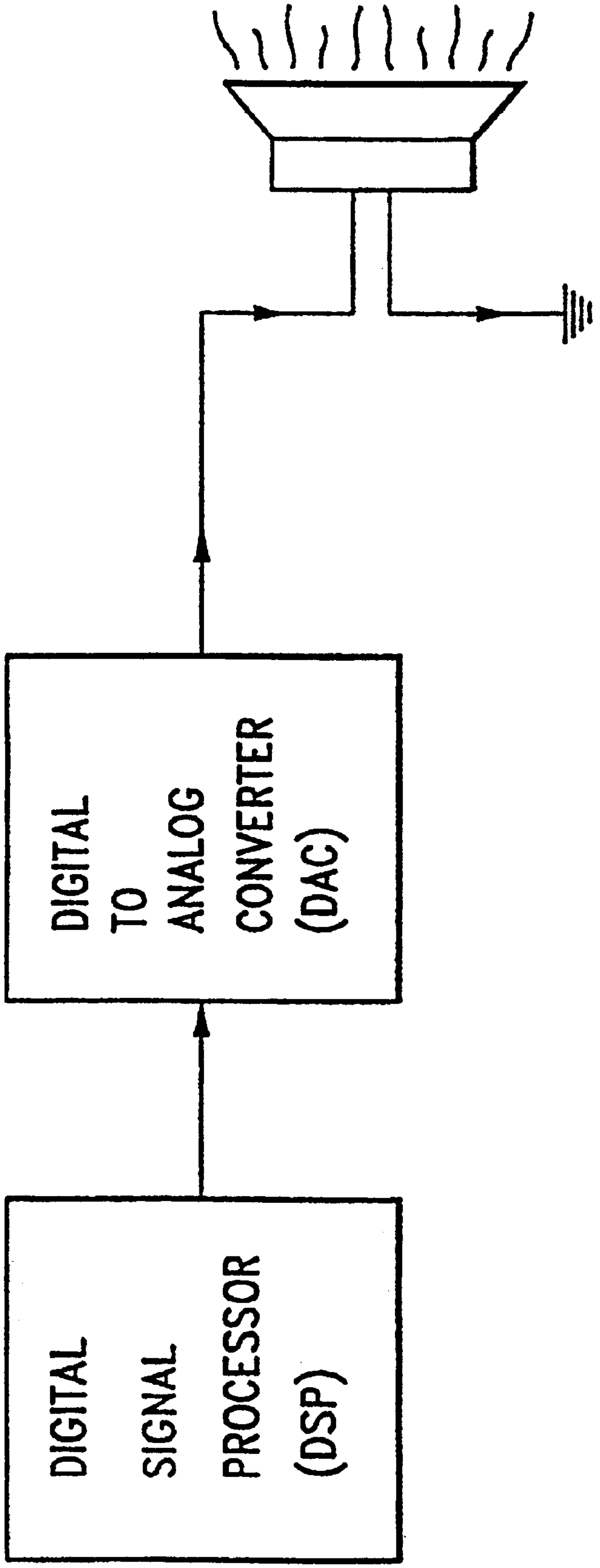
Fig. 4 (PRIOR ART)
FIG. 4 shows schematically prior art circuitry for driving a cellular phone sound system using an analog electrodynamic speaker system.

The acoustic sound energy is designed to be intensified by the resonant cavity 18 in the range of about 10 HZ to about 30 kHz. This frequency range is chosen because it covers the spectrum of frequencies human beings are capable of hearing. Although the resonant cavities 18 depicted in FIGS. 1 and 2 are rectangular in shape, as discussed in more detail below, the resonant cavity 18 may be manufactured in any desired shape. Of course, in best modes of the invention, the resonant cavity is optimally designed to intensify the sound pressure changes generated by deformation of said piezoelectric element 12.

The digital piezoelectric transducer 10 takes advantage of a physical property of piezoelectric material, in that, it deforms proportionally to the area covered by a voltage difference. As a result of this phenomenon, the more area covered by each electrically isolated conductive section 14, the greater the deformation of the piezoelectric element 12 from its center position when a voltage is applied to each electrically isolated conductive section 14. The electrically isolated conductive sections 14 may be provided to cover different surface areas of said piezoelectric element 12 in almost any shape, including rectangular and circular. Therefore, digital piezoelectric transducers may be made in many different shapes and sizes.

As previously discussed, the piezoelectric element 12 in a digital piezoelectric transducer 10 is connected with a plurality of electrically isolated conductive sections 14 distributed on one side of the piezoelectric element 12. Each of the electrically isolated conductive sections 14 is integrally formed to cover predetermined surface areas on said piezoelectric element 12, forming a binary progression. Also, each electrically isolated conductive section 14 on the digital piezoelectric transducer 10 is driven by a different bit of a parallel signal carrying audible message.

The least significant bit of a parallel digital signal is coupled to the electrically isolated conductive section 14 that covers the least amount of surface area on the piezoelectric element 12. The most significant bit of the parallel signal is connected to the electrically isolated conductive section 14 which covers the most surface area on the piezoelectric element 12. Accordingly, each bit of the parallel digital signal will cover an increasing amount of surface area as the bit order increases from least significant bit to most significant bit.

Figure 1A:
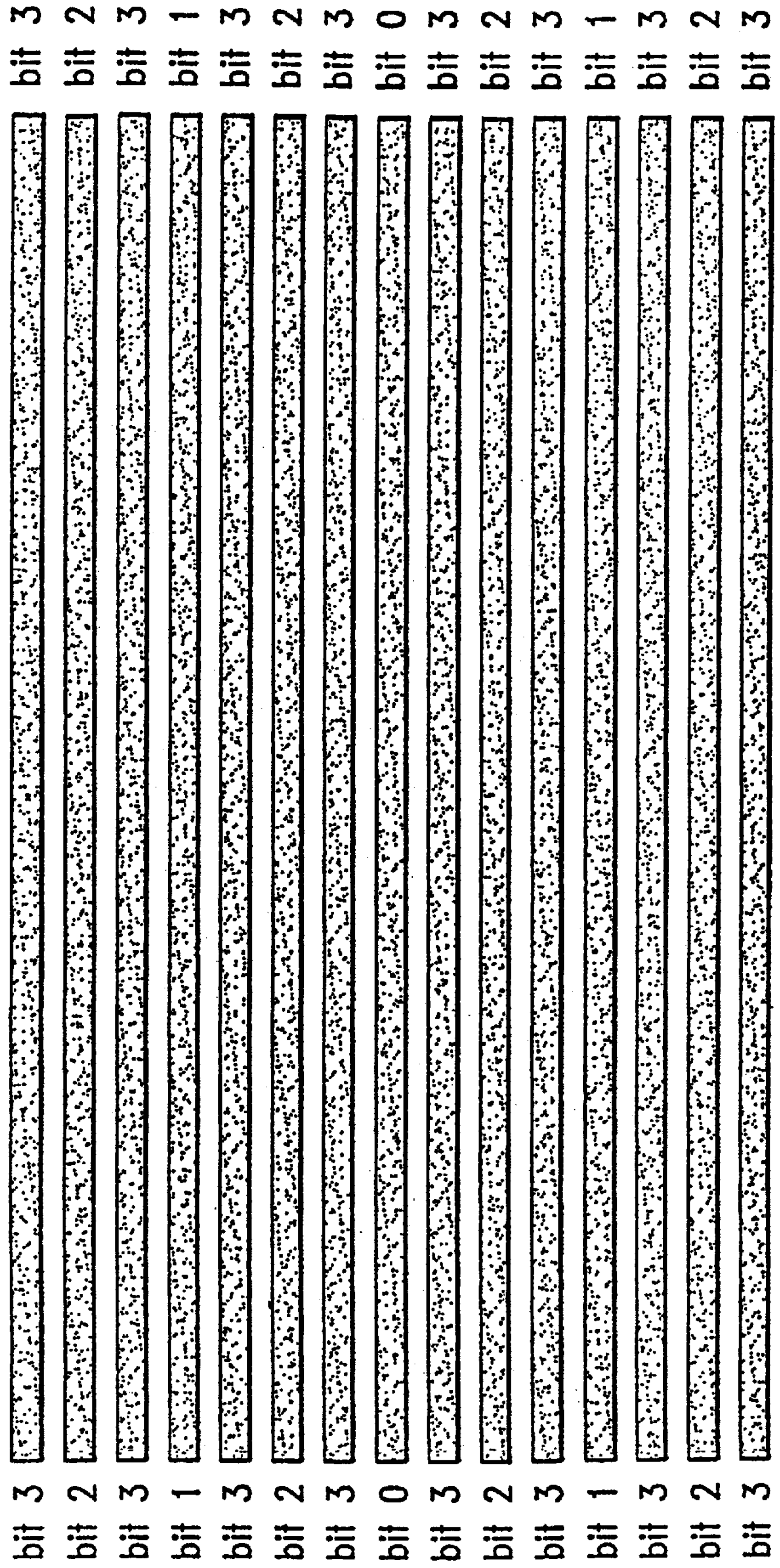
FIG. 1A shows the strip/bit distribution for a four-bit piezoelectric transducer.

The digital piezoelectric transducer 10 disclosed may be designed to be driven by as many bits as the designer chooses. For example a digital piezoelectric transducer may be designed to handle a digital drive signal of 4, 8, 16, 32 or any other number of bits in length. Typically, however, it is convenient to use signals having a length that is in multiples of four. An eight-bit digital piezoelectric transducer 10 is disclosed here as an example only and is by no means meant as a limitation. A four-bit piezoelectric transducer is depicted in FIG. 1A having 15 electrically isolated conductive strips, instead of the 255 that would be used for an eight-bit system. The digital piezoelectric transducer 10 can be designed to be driven by an n-bit digital word and will have 2–1 electrically isolated conductive strips 14 formed thereon.

An eight-bit digital piezoelectric transducer can be designed in a wide range of sizes and shapes. As illustrated graphically in FIGS. 6A, 6B and 6C, a piezoelectric element 12 used in the present invention may have electrically isolated conductive strips 14 manufactured in many different shapes and sizes. Each electrically isolated conductive section 14 covers a precisely predetermined surface area of the piezoelectric element 12 as shown in Tables 1 and 2 provided below.

TABLE 1

(Referring to FIG. 6B)

| Bit | Percentage of Covered Area |
|---|---|
| 7 | 50% |
| 6 | 25% |
| 5 | 12.5% |
| 4 | 6.25% |
| 3 | 3.125% |
| 2 | 1.562% |
| 1 | 0.7812% |
| 0 | 0.3905% |

TABLE 2

(Referring to FIG. 6 A,C)

| Bit | Angular Section (Degrees) |
|---|---|
| 7 | 45 |
| 6 | 22.5 |
| 5 | 11.25 |
| 4 | 5.625 |
| 3 | 2.8125 |
| 2 | 1.40625 |
| 1 | 0.703125 |
| 0 | 0.351563 |

The present invention also provides novel methods of digitally driving a piezoelectric transducer 10. A piezoelectric element 12 has a plurality of electrically isolated conductive sections 14 attached to one side of the piezoelectric element 12. In addition, a conductive common plate 16 is attached to the other side of the piezoelectric element 12. In order to drive a digital piezoelectric transducer 10 a digital drive signal must be generated and then supplied to the electrically isolated conductive sections 14 in parallel. For example, the digital drive signal may take the form of a parallel 4, 8, 16, or 32 bit signal.

Figure 5:
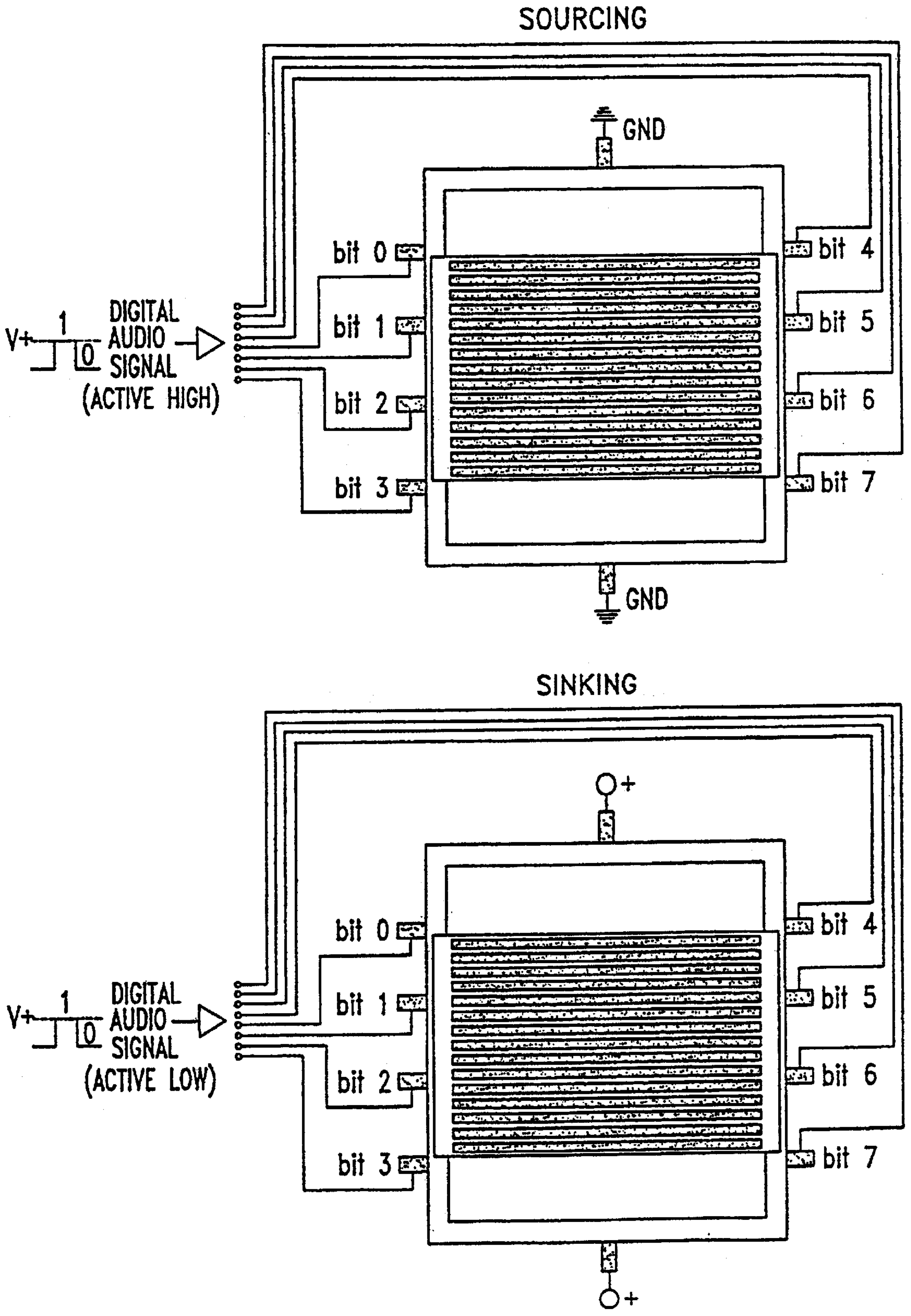
FIG. 5 is a simplified wiring schematic for connecting an eight-bit digital signal to a digital piezoelectric transducer of this invention.

The digital drive signal is supplied to the digital piezoelectric transducer 10 by a means for creating a parallel digital signal such as a microprocessor or digital signal processor. Another way to drive the piezoelectric transducer 10 is by connecting the conductive common plate (ground) 16 to the positive power supply and outputting an active low pulses from the digital circuitry. This driving method is called sinking, as opposed to sourcing, that is, the method of using active high pulses to output digital signals. (See FIG. 5). The digital signals that are used to drive the piezoelectric element may be supplied by the output ports of standard microprocessor based systems. The voltage level of the digital signals used to drive the piezoelectric element can vary, however, in preferred embodiments of the invention they range somewhere between 2.5 and 5 volts. In order to intensify and direct the acoustic sound pressure created by the deformation of the piezoelectric element 12, a resonant cavity 18 may be coupled with said piezoelectric element 12. The resonant cavity 18 also provides support for said piezoelectric element 12 and is supplied with a plurality of fixed contacts 20 connected with said plurality of electrically isolated conductive sections 14. The resonant cavity is designed to optimally intensify acoustic sounds that cover the audible range of human hearing.

In preferred embodiments of the invention, the step of forming the plurality of electrically isolated conductive sections 14 in a predetermined surface area will be optimally done to make the digital piezoelectric transducer 10 create the best sound quality. The surface areas of said electrically isolated conductive sections 14 should preferably be arranged in a binary progression from least significant bit to most significant bit. This gives the engineer who uses said digital piezoelectric transducers much greater control over said digitally driven piezoelectric transducer 10 in operation.

Digitally driven piezoelectric traducer 10 can be employed in a variety of electronic equipment to eliminate the noise associated with analog speaker systems of the prior art. Cellular phones are an ideal application for such transducers. Current cellular antenna technology allows transfers of acoustic information in serial digital format. Therefore, the step of converting the serial signal carrying the acoustic information into a plurality of parallel driving signals carrying said acoustic information must be completed. As most digital signal processors ("DSP") and microprocessors contain parallel output/input ports, this step is limited to minor changes in the DSP or microprocessor software. The parallel driving signals are connected with the electrically isolated conductive sections 14 to provide the acoustic sound energy.

In addition, a digital piezoelectric transducer 10 such as disclosed here may be incorporated into a hand-held personal communications device. Such a device is typically provided with a means for receiving an information signal broadcast from a cellular or satellite communication systems. The cellular communications systems may be of any type or mode, such as analog, CDMA, TDMA, or FDMA. The hand-held personal communications device would also be provided with a means for transforming said information signal into a parallel digital signal. This operation is typically performed by such devices as a digital signal processor or a microprocessor. Finally, a digital piezoelectric transducer 10 will be incorporated into the design and be coupled with said means for transforming the information signal into a parallel digital signal within the hand-held communication device.

The use of a digital piezoelectric transducer 10 to create an audible sound from application of a parallel digital signal has benefits in the fact that less EMI is created because of the elimination of analog circuitry. In addition, because a digital piezoelectric transducer 10 has no coil or fragile speaker and does not require analog circuitry, the system will remain relatively unaffected by EMI. Other benefits include being lightweight, small, inexpensive, and capable of generating high-pressure sounds. Further benefits of digitally driven piezoelectric transducers will be seen by those skilled in the art.

While the invention has been described in its currently best known modes of operation and embodiments, other modes and embodiments of the invention will be apparent to those skilled in the art. The invention is limited only by the scope of the claims that follow.

What is claimed is:

1. A digital piezoelectric transducer, comprising:

a piezoelectric element;

a conductive common plate carried by a first side of said piezoelectric element;

first and second sets of electrically isolated conductive sections carried by a second side of said piezoelectric element; and first and second electrically isolated connections adapted to provide first and second bits of a digital signal to said first and second sets of conductive sections such that said first set of conduction sections is driven by said first bit and said second set of conduction sections is driven by said second bit;

wherein said first set of conductive sections includes a plurality of electrically isolated first conductive sections each of which is driven by said first bit.

2. The digital piezoelectric transducer of claim 1 further comprising a resonant cavity connected with said piezoelectric element for intensifying acoustic energy generated by said piezoelectric element.

3. The digital piezoelectric transducer of claim 2 wherein the acoustic energy is intensified by said resonant cavity in the range of about 10 Hz to about 30 kHz.

4. The digital piezoelectric transducer of claim 1 wherein each of said first and second sets of electrically isolated conductive sections is integrally formed to cover a different predetermined surface area on said piezoelectric element.

5. The digital piezoelectric transducer of claim 1 further comprising means attached to said piezoelectric element for providing parallel digital signals to said first and second sets of electrically isolated conductive sections.

6. The digital piezoelectric transducer of claim 1 wherein said first and second sets of electrically isolated conductive sections form a binary progression of surface area, each of said first and second sets of electrically isolated conductive sections being driven by a different bit of parallel digital signals.

7. The digital piezoelectric transducer of claim 1 wherein said resonant cavity has means including a plurality of fixed contacts that are connected with said first and second sets of electrically isolated conductive sections for connecting parallel digital signals to said first and second sets of electrically isolated conductive sections.

8. The digital piezoelectric transducer of claim 1 wherein at least one conductive section of said second set of conductive sections is interposed between a pair of said first conductive sections.

9. The digital piezoelectric transducer of claim 1 wherein said second set of conductive sections includes a plurality of discrete second conductive sections each of which is driven by said second bit.

10. The digital piezoelectric transducer of claim 9 wherein at least one of said second conductive sections is interposed between a pair of said first conductive sections.

11. The digital piezoelectric transducer of claim 9 wherein said first set of conductive sections has a total surface area that is twice a total surface area of said second set of conductive sections.

12. The digital piezoelectric transducer of claim 11 wherein there are twice as many first conductive sections as there are of second conductive sections.

13. The digital piezoelectric transducer of claim 11 including:

a third set of electrically isolated conductive sections carried by said second side of said piezoelectric element; and a third electrically isolated connection adapted to provide a third bit of said digital signal to said third set of conductive sections such that said third set of conduction sections is driven by said third bit;

wherein said third set of conductive sections includes a plurality of discrete third conductive sections each of which is driven by said third bit; and wherein said third set of conductive sections has a total surface area that is twice said total surface area of said first set of conductive sections.

14. The digital piezoelectric transducer of claim 13 wherein said first, second, and third conductive sections each have substantially the same size and shape.

15. The digital piezoelectric transducer of claim 14 wherein said first, second, and third conductive sections are rectangular and are interleaved in alternating manner across said second side of said piezoelectric element.

16. The digital piezoelectric transducer of claim 1 wherein each of said first conductive sections is wedge-shaped.

17. The digital piezoelectric transducer of claim 16 wherein at least one conductive section of said second set of conductive sections is interposed between a pair of said first conductive sections.

18. The digital piezoelectric transducer of claim 1 wherein each of said first conductive sections is rectangular.

19. The digital piezoelectric transducer of claim 18 wherein at least one conductive section of said second set of conductive sections is interposed between a pair of said first conductive sections.

20. The digital piezoelectric transducer of claim 1 further including a resonant cavity connected with said piezoelectric element for intensifying acoustic energy generated by said piezoelectric element in the range of about 10 Hz to about 30 kHz, and wherein said piezoelectric element is adapted to directly generate the acoustic energy intensified by said resonant cavity.

* * * * *